United States Patent [19]

Gluckstern et al.

[11] Patent Number: 4,580,098

[45] Date of Patent: * Apr. 1, 1986

[54] PERMANENT MAGNET NMR IMAGING APPARATUS

[75] Inventors: Robert L. Gluckstern, College Park, Md.; Ronald F. Holsinger, Carlisle, Mass.

[73] Assignee: E. I. Du Pont de Nemours and Company, Wilmington, Del.

[ * ] Notice: The portion of the term of this patent subsequent to Feb. 5, 2002 has been disclaimed.

[21] Appl. No.: 490,660

[22] Filed: May 2, 1983

[51] Int. Cl.$^4$ ............................................. G01N 24/08
[52] U.S. Cl. ..................................... 324/307; 324/318
[58] Field of Search ............... 324/307, 308, 309, 310, 324/313, 318, 319, 320

[56] References Cited

U.S. PATENT DOCUMENTS 4,498,048  2/1985  Lee ...................................... 324/307

OTHER PUBLICATIONS

K. Halbach, "Design of Permanent Multipole Magnets with Oriented Rare Earth Colbalt Material", Nuclear Instruments & Methods 169 (1980).
M. Goldsmith et al., "NMR in Cancer:XVII. A Superconductive NMR Magnet for a Human Sample", Physiol. Chem. & Phys. 9 (1977).
P. Mansfield, "Proton Spin Imaging by Nuclear Magnetic Resonance", Contemp. Phys., 1976, vol. 17, No. 6, 553–576.
D. I. Hoult et al., "Electromagnet for Nuclear Magnetic Resonance Imaging", Rev. Sci. Instrum. 52(9), Sep. 1981.
D. I. Hoult, "Radio Frequency Coil Technology in NMR Scanning", R. F. Coil Technology, pp. 33–39.
P. Hanley, "Superconducting and Resistive Magnets in NMR Scanning", Magnets, pp. 41–49.
Technology/2, pp. 33–39, Jan./Feb. 1982.
"Nuclear Magnetic Resonance Imaging in Medicine", edited by Leon Kaufman, PhD. et al, New York (Chapter 3, pp. 30–52 and Chapter 4, pp. 53–67).
K. Halbach, "Physical and Optical Properties of Rare Earth Cobalt Magnets", NIM 187 (1981) 109.
K. Halbach, "Perturbation Effects in Segmented Rare Earth Cobalt Multiple Magnets", NIM 198 (1982) 213–215.
Charles G. Masi, (Magnicon Corp.), "Lodestone Technology Comes to NMR Imaging", Diagnostic Imaging, Apr. 1983, pp. 32–35.
Richard diMonda, Nuclear Magnetic Resonance Guideline Report—AHA Hospital Technology Series, vol. 2, No. 8, Mar. 1983.
R. D. Hay and C. G. Masi, New England Nuclear Corp., "A Variable Strength Permanent Magnet Dipole", Proceedings of the 1981 Linear Accelerator Conference, Oct. 19, 1981, pp. 84–86.

*Primary Examiner*—Stewart J. Levy
*Assistant Examiner*—Robert R. Raevis

[57] ABSTRACT

An NMR imaging apparatus is described having a desired imaging volume for imaging of biological tissue, said apparatus comprising bias means for generating a bias field, means for generating gradient fields, and radio frequency means for applying a pulse of electromagnetic radiation to the biological tissue and for detecting the resultant signals emitted from said tissue; wherein said bias means comprises a plurality of dipole ring magnets, each dipole ring magnet comprising a plurality of segments, each segment comprising an oriented, anisotropic permanent magnet material arranged in a ring so that there is a substantially continuous ring of permanent magnet material.

9 Claims, 21 Drawing Figures

PERMANENT MAGNET NMR IMAGING APPARATUS

This invention relates to apparatus for determining nuclear magnetic resonance (NMR), particularly to apparatus for imaging biological tissue, and more particularly to such apparatus wherein the magnetic field is produced substantially by permanent magnet materials.

BACKGROUND OF THE INVENTION

In the last few years advances in nuclear magnetic resonance (NMR) techniques have made it possible to form two and three dimensional spin density images of solids and liquids. A number of novel and sophisticated variants have also been introduced to the rapidly expanding field of imaging. An important aspect of all these developments is the ability to form images of biological tissue in vivo. The NMR method is non-invasive and has a much lower radiation hazard than the more usual X-ray imaging methods.

In addition to producing spin density pictures, these new NMR imaging techniques can all be adapted to measure spatial variations of the spin-lattice relaxation time in a specimen. The cell water in cancerous tissue, for example, is known to have longer spin-lattice relaxation time than that in normal tissue. Thus NMR imaging, though in its infancy, holds promise as a diagnostic tool for the early detection of tumors.

The NMR imaging techniques to be described all rely on the preparation and/or observation of the nuclear spin system in the presence of one or more magnetic field gradients. The field gradients serve to spatially differentiate regions of the specimen by changing the Larmor resonance frequency of the spins from one region of the specimen to another.

Individual protons or hydrogen nuclei are found in most organic and biological material and have a natural isotopic abundance of 99.9844 percent. The other 0.0156 percent of nuclear sites is taken up with the other naturally occurring heavy hydrogen isotope, deuterium.

Each nucleus has associated with it a small nuclear magnetic moment and a quantity of angular momentum called spin. Regarded classically, the combined effect of magnetic moment and spin causes a proton to precess about the direction of an applied static magnetic field much as a spinning top precesses about the gravitational field direction if perturbed from the upright position. For protons, the precessional frequency is independent of the angle of inclination of the magnetic moment with respect to the static magnetic field and is called the Larmor angular frequency $\omega_o$. However, it does depend directly on the magnitude of the static magnetic field $B_o$ through the relationship $\omega_o = \gamma B_o$, where the constant is called the magnetogyric ratio. This relationship is the key to much of what follows. If $B_o$ is varied then $\omega_o$ will vary. If a linear magnetic field gradient is superimposed on an otherwise spatially uniform $B_o$, then the protons in a specimen placed in these fields would experience a magnetic field higher than $B_o$ in some places and lower in others. An account of the development of NMR spin imaging is given by Mansfield, *Contemp. Phys.* Vol. 17, No. 6, pp. 553-576 (1976). The basic principles of NMR necessary to understand imaging are discussed and main methods of imaging are described and illustrated with examples of images of proton spin distributions in a number of biological specimens.

NMR imaging of humans for medical diagnostic purposes presents the magnet designer with formidable problems of an unusual nature Hoult et al., *Rev. Sci. Instrum.* 52(9), pp. 1342-51 Sept. (1981) state that a magnet is required which produces a field of at least 0.1 T with a homogeneity of preferably 1 ppm over the region of interest of the patient, say the head or torso In addition, Hoult et al. state that linear field gradients of up to $10^{-2} Tm^{-1}$ in any direction may be required. A short term field stability of better than 0.1 ppm may be mandatory over a period of a second in order to avoid phase noise on the NMR signal, while the long term stability may need to be about 1 ppm. Further, all this must be accomplished in a hospital environment where it is likely that serious perturbations will be caused by large amounts of steel (reinforcement, water pipes, etc.), in the building structure, and by other ferromagnetic objects which will be moving (elevators, beds, nearby trucks, etc.). Iron core electromagnets have not been used because of difficulty in achieving the required field uniformity and because of the excessive weight of these magnets. Current designs are therefore generally aircored electromagnets of either resistive or superconducting design. A spherical shaped electromagnet for NMR imaging is described by Hoult et al., supra. A superconductive NMR magnet for in vivo imaging is described by Goldsmith et al., *Physiol. Chem. & Phys.*, 9, pp. 105-107 (1977). In addition, Hanley discussed superconducting and resistive magnets in NMR scanning in a paper presented at the 1981 International Symposium on Nuclear Magnetic Resonance Imaging held at the Bowman Gray School of Medicine, Wake-Forest University, Winston-Salem, N.C. A superconducting magnet can attain much higher fields than a simple electromagnet but its cost will be much higher.

A permanent magnet system would be superior to prior art superconducting and resistive electromagnet designs in the following ways:
(a) There is no need for a means of generating the large amounts of power required to maintain the field as in the resistive magnet systems.
(b) There is no need to provide cooling means to either remove generated heat as in the resistive magnets or to maintain cryogenic temperatures as in the superconducting magnets.
(c) The field of the permanent magnet is not subject to power supply drift like that of resistive magnets or superconducting magnets not operated in the persistant current mode.
(d) The field of the permanent magnet is not subject to gradual decay like that of superconducting magnets operating in the persistent current mode.
(e) The material used can be a readily available ferrite magnet material that is transparent to electromagnetic waves of the frequencies of interest (5 MHz to 15 MHz).
(f) The external field strength falls off rapidly with distance away from the magnet, leading to significantly reduced interference with the bias field from ferromagnetic objects in the vicinity of the apparatus.

NMR permanent magnet designs using a ferromagnetic pole structure do not make efficient use of the permanent magnet magnetic flux potential. Thus, new permanent magnet NMR designs making more efficient use of the magnetic flux potential are desired.

SUMMARY OF THE INVENTION

The present invention provides a permanent magnet NMR imaging apparatus for imaging of biological tissue. The permanent magnet NMR imaging apparatus in accord with this invention comprises bias means for generating a bias field, means for generating gradient fields, and radio frequency means for applying a pulse of electromagnetic radiation to the nuclear spins associated with biological tissue at their Larmor frequency and detecting the resultant signals emitted by them; wherein said bias means comprises a plurality of dipole ring magnets, each dipole ring magnet comprising a plurality of segments comprising an oriented, anistropic permanent magnet material. The NMR imaging apparatus of this invention does not use a ferromagnetic pole structure and makes efficient use of the magnetic flux potential.

Preferably each dipole ring magnetic comprises eight segments of permanent magnet material arranged in a ring so that the easy axis orientation is determined by the formula $$\alpha = 2\theta - (\pi/2)$$

where $\theta$ is the angle between the radial symmetry line of a segment and the x-axis (which is in the plane of the dipole ring magnet) and $\alpha$ is the angle between said radial symmetry line and the x-axis.

DESCRIPTION OF THE INVENTION

In accord with the present invention an NMR imaging apparatus is provided wherein the bias magnetic field is generated by permanent magnet dipoles. The bias magnetic field is substantially stationary and uniform. As used herein "a substantially stationary and uniform magnetic field" is a magnetic field that has sufficient uniformity and that is sufficiently stable to obtain images of biological tissue as desired. Preferably the bias magnetic field does not vary by more than $5 \times 10^{-4}$ in the design imaging volume or space in which the test specimen is placed, and more preferably the bias field variance is less than $1 \times 10^{-5}$. Further, the field stability is preferably no worse than $5 \times 10^{-6}$ (sec$^{-1}$). However, as noted above these parameters can be varied depending upon the acceptable quality of the image desired.

Figure 1:
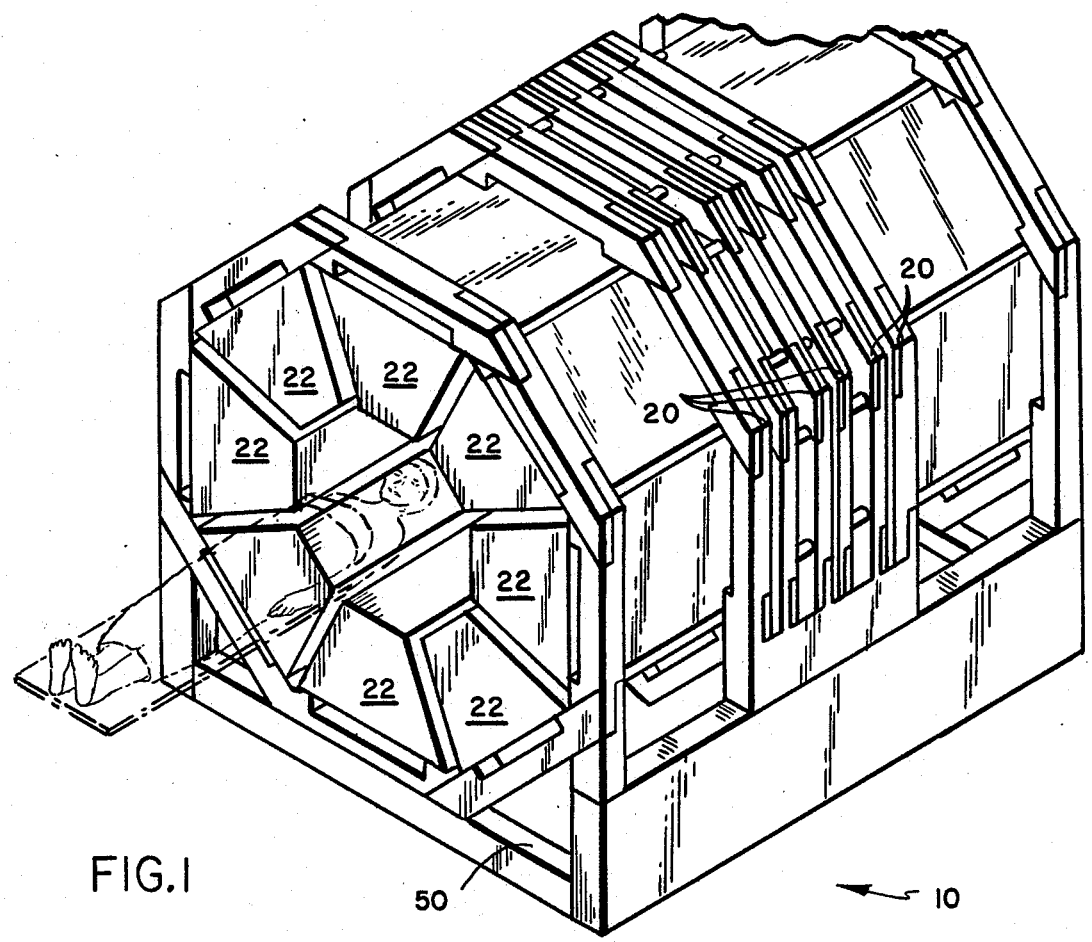
FIG. 1 is an isometric view of a permanent magnet NMR imaging apparatus in accord with the present invention
Figure 2:
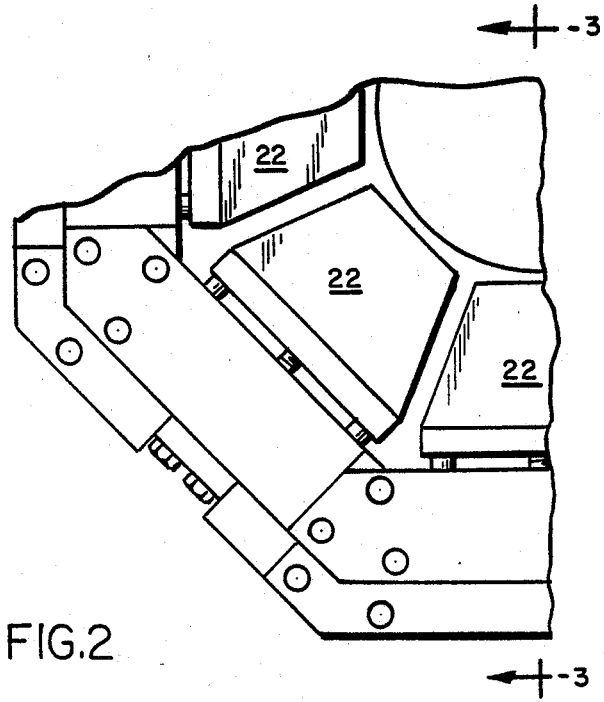
FIG. 2 is a front elevational view partially cut away of the NMR imaging apparatus illustrated in FIG. 1.
Figure 3:
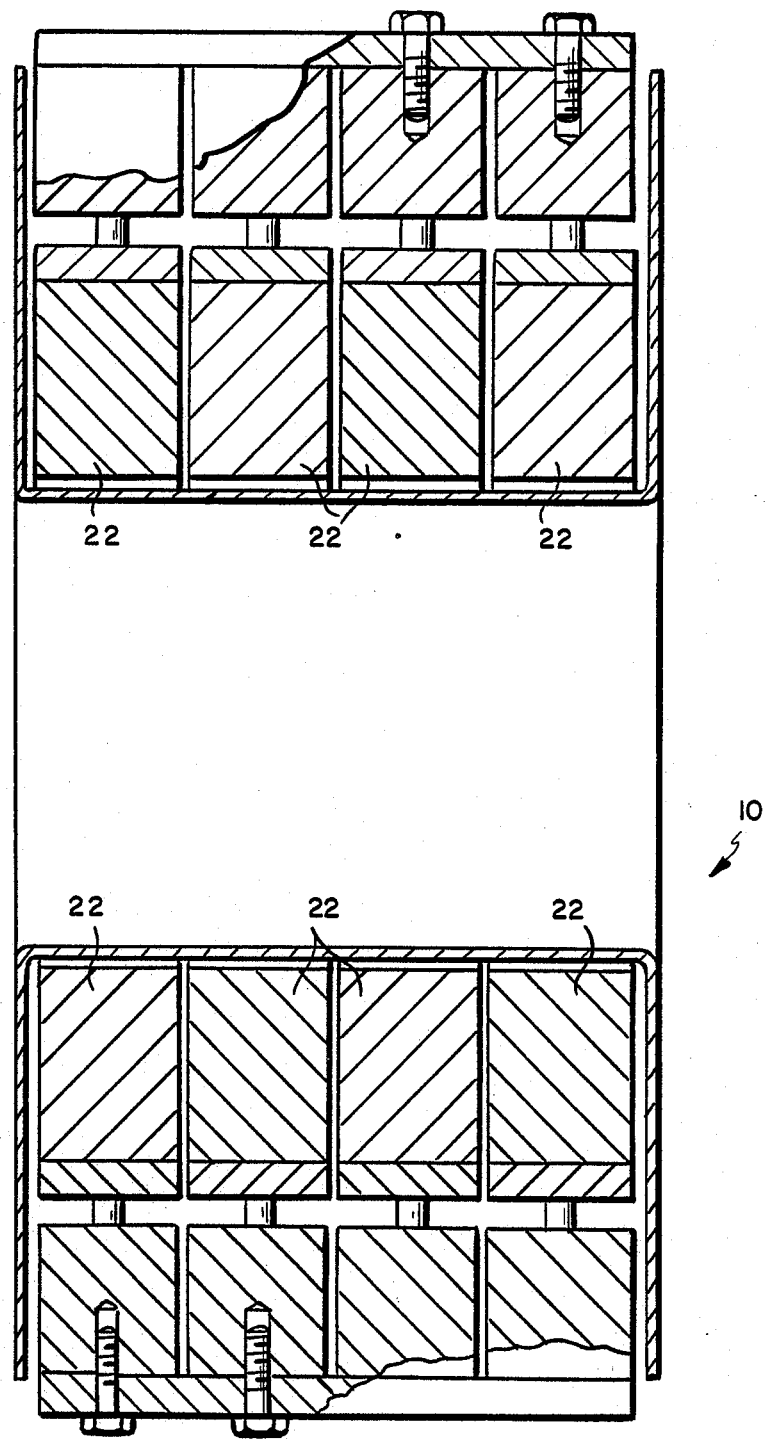
FIG. 3 is a cross-sectional view of the apparatus of FIG. 2 taken along line 3—3 of FIG. 2.

The invention will be further described with reference to the drawings wherein FIG. 1 illustrates an NMR imaging apparatus 10, in accord with one embodiment of the invention, having an opening of sufficient diameter to accept an adult human for scanning. The NMR imaging apparatus 10 consists of four collars or rings 20, each ring comprising a dipole magnet made of permanent magnet material.

Each ring or collar 20 consists of eight segments 22 of permanent magnet material. More or less segments can be used. However, eight segments provide quite satisfactory results in the embodiment described. The permanent magnet material is an oriented, anisotropic permanent magnet material, such as a rare-earth/cobalt material, or a ferrite ceramic material, or the like. Preferred materials have a unity permeability. Suitable materials include, for example, sammarium cobalt, barium ferrite, strontium ferrite, and the like. Conveniently each segment 22 has a trapezoidal shape.

Figure 5:
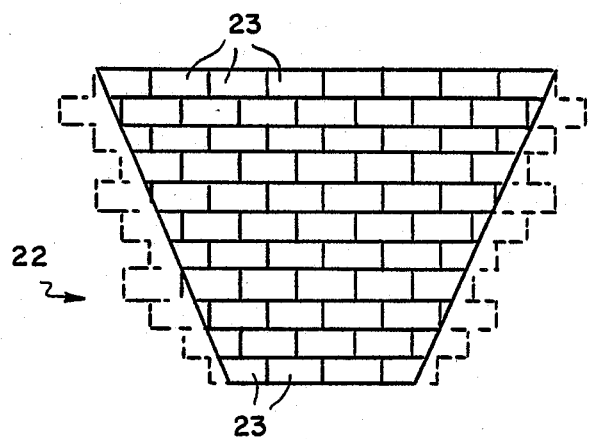
FIG. 5 is a front elevational view of a segment of permanent magnet material formed from individual bricks.
Figure 6:
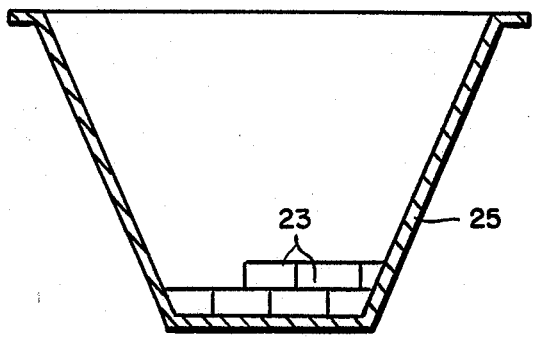
FIG. 6 is a front elevational view in cross-section of a form for laying up individual bricks to form a segment of permanent magnet material of the desired size and shape as shown in FIG. 5.

Each segment is built up to the desired size from individual bricks 23, as illustrated in FIG. 5. Each segment 22 could also be made from a solid block of such permanent magnet material. Bricks 23 positioned along the surfaces of each segment 22 are suitably cut to provide the desired final shape. To form each segment 22, the individual bricks 23 are laid up in a form 25, which is conveniently made of fiberglass. The surfaces of each brick 23 that will come in contact with the surface of other bricks are coated with an adhesive prior to laying the bricks in the form 25.

Unmagnetized bricks having a dimension of about 15 cm × 10 cm × 2.5 cm are conveniently used to build each segment 22. The bricks are trimmed to ensure that they have sharp corners so that they fit tightly together in the form and leave no air gaps. The bricks are thoroughly cleaned of oil, grease and loose material. A two-part adhesive has been found convenient. The surface of one brick is coated with, for example, Loctite Loquic Primer N or its equivalent. The surface of the second brick that contacts the coated surface of the first brick is then coated with, for example, Loctite Superbonder 326, or its equivalent. After the bricks are laid up in form 25, the bricks are allowed to cure for a sufficient time so that the segment 22 can be removed from the form 25. Typically about ten minutes is sufficient for the initial curing. However, the time will vary depending upon the particular adhesive being used and other conditions such as temperature. The initially cured segment 22 is thoroughly cleaned with a degreasing solvent and sufficient time is allowed to fully cure the adhesive.

Figure 7:
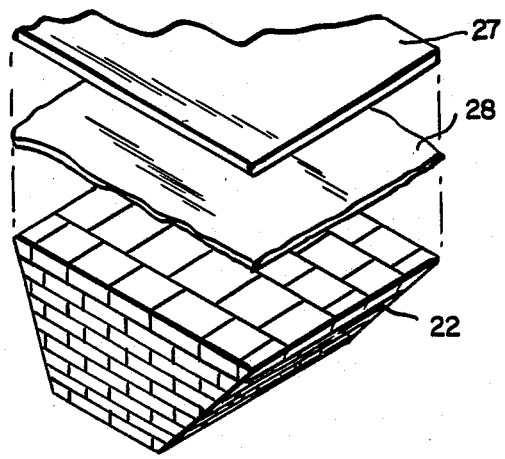
FIG. 7 is an exploded isometric view of a segment of permanent magnet material with a backing plate.

The segment 22 is then placed in the magnetizing coil of a magnetizer capable of producing a peak pulsed field of at least 8 kilo-oersteds throughout the volume of the segment to fully magnetize the permanent magnet material. The segment is clamped in the correct orientation in accord with the formula $\alpha = 2\theta - (\pi/2)$ as aforesaid depending upon the predetermined position of the segment in the ring 20. A suitable fixture made of non-ferromagnetic, non-conducting material is used to clamp the segment. After pulsing the magnetizer to magnetize the permanent magnet material, the segment is removed and an aluminum backing plate 27 is bonded to the segment 22 using an epoxy resin 28 or the like as illustrated in FIG. 7.

Figure 8:
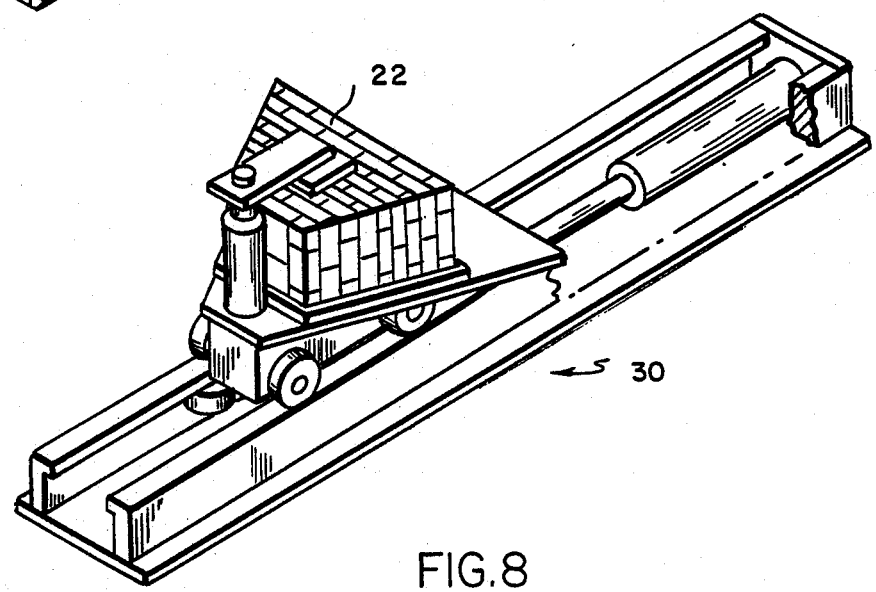
FIG. 8 is an isometric view of a segment as shown in FIG. 7 mounted on a positioning ram for forming a dipole ring magnet.
Figure 9:
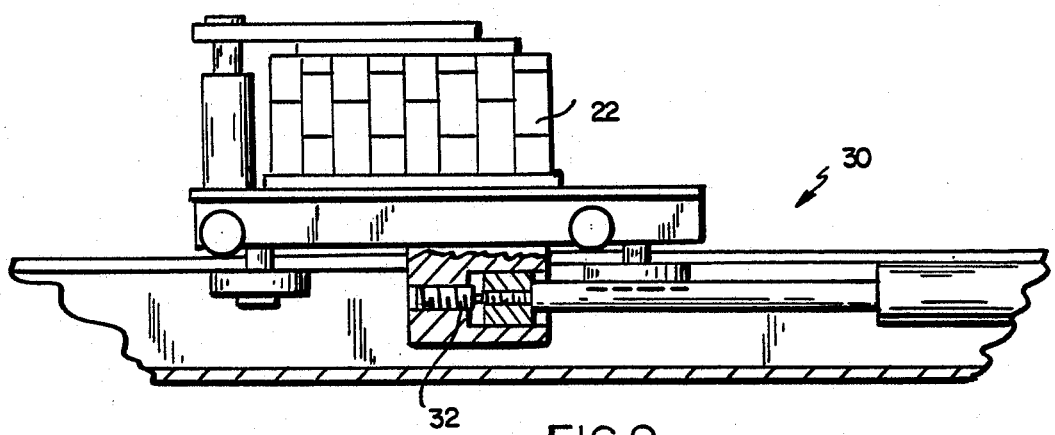
FIG. 9 is a side elevational view partly in cross-section of the positioning ram and mounted segment of FIG. 8.
Figure 10:
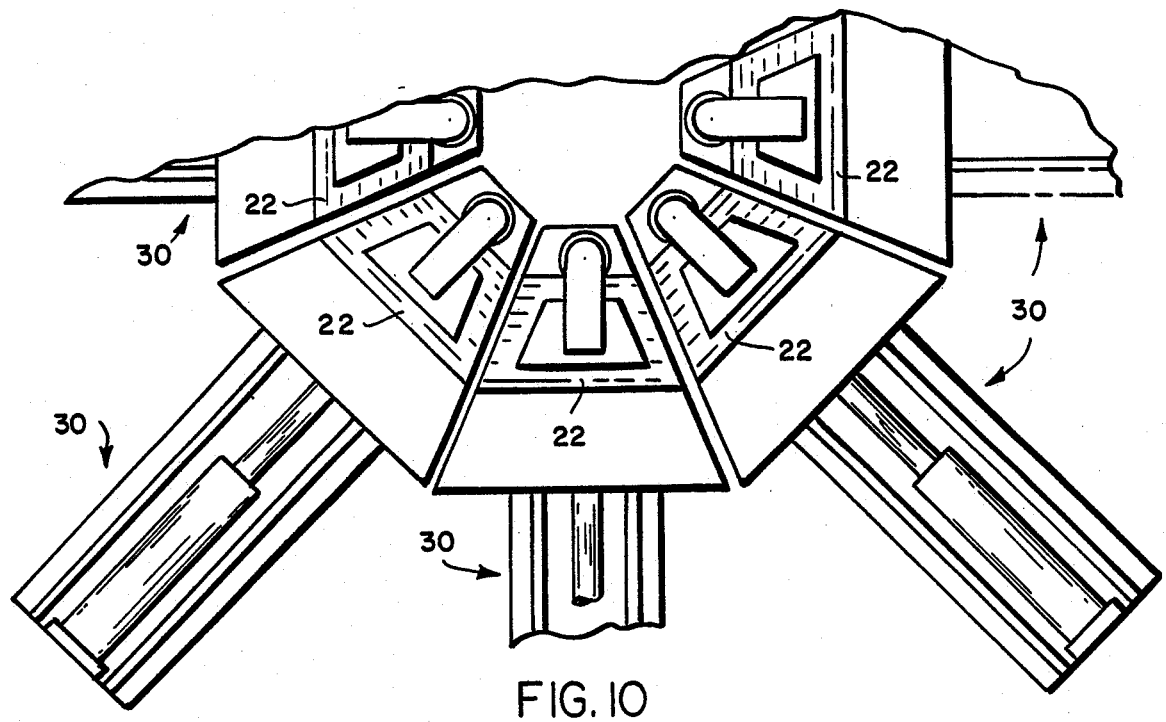
FIG. 10 is a plan view of a plurality of positioning rams mounted in a jig for forming a dipole ring magnet.

Each of eight segments 22 is then clamped in a positioning ram 30 as illustrated in FIGS. 8 and 9, with the positioning ram 30 at its outer stop. The fine adjustment screw 32 on each ram 30 is set near the middle of its travel as illustrated in FIG. 9. When all eight segments are positioned in their rams 30, in accord with the predetermined alignment of the easy axis of each segment, the rams are moved forward to their innermost stops as illustrated in FIG. 10.

Figure 15:
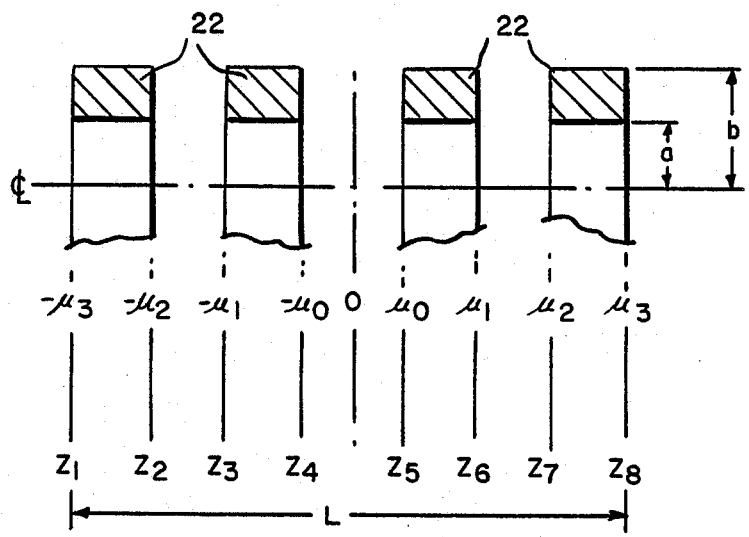
FIG. 15 is a sketch of four ring dipoles in cross-section illustrating their physical parameters.

The initial design and optimization of an NMR imaging apparatus in accord with the present invention will now be illustrated with respect to the configuration shown in FIG. 15. Consider four ring dipoles placed along an axis as shown in FIG. 15. The field $B_y(x, y, w)$ is defined as:

$$B_y(x,y,w) = \frac{g}{4} \sum_{m=1}^{N_{coil}} B_{ym}$$

$$B_{ym} = \sum_{\substack{l=0 \\ (even)}}^{\infty} \frac{B_l}{a_m{}^l} \sum_{j=0}^{l/2} \left( \frac{(-1)^j}{2^{2j} j! (j+1)!} \frac{l!}{(l-2j)!} \right.$$

$$\left. w^{l-2j}((x^2+y^2)^j + 2jy^2(x^2+y^2)^{j-1}) \right)$$

-continued $$B_l = H_l\left(\frac{b_m}{a_m}, \frac{z_{2m}}{a_m}\right) - H_l\left(\frac{b_m}{a_m}, \frac{z_{2m-1}}{a_m}\right)$$

$$H_l(q,p) = G_l(p) - q^{-l} G_l(p/q)$$

$$G_l(u) = \frac{-2}{l!(1+u^2)^{l+\frac{1}{2}}} \sum_{j=\phi}^{l/2} \frac{(-1)^j u^{l+1-2j}}{2^{2j}(j!)^2} \frac{(l+1)!}{(l+1-2j)!}$$

$$\left(1 - j\frac{l^2 + 5l + 2}{l(l+1)}\right)$$

wherein x, y and w are the spatial coordinates of any point with the w axis being the axis of the ring dipoles, N is the number of ring dipoles, and g is the remanent field. The variables a, b and z are physical parameters of the ring dipole configuration as illustrated for four (4) ring dipoles in FIG. 15.

Figure 16:
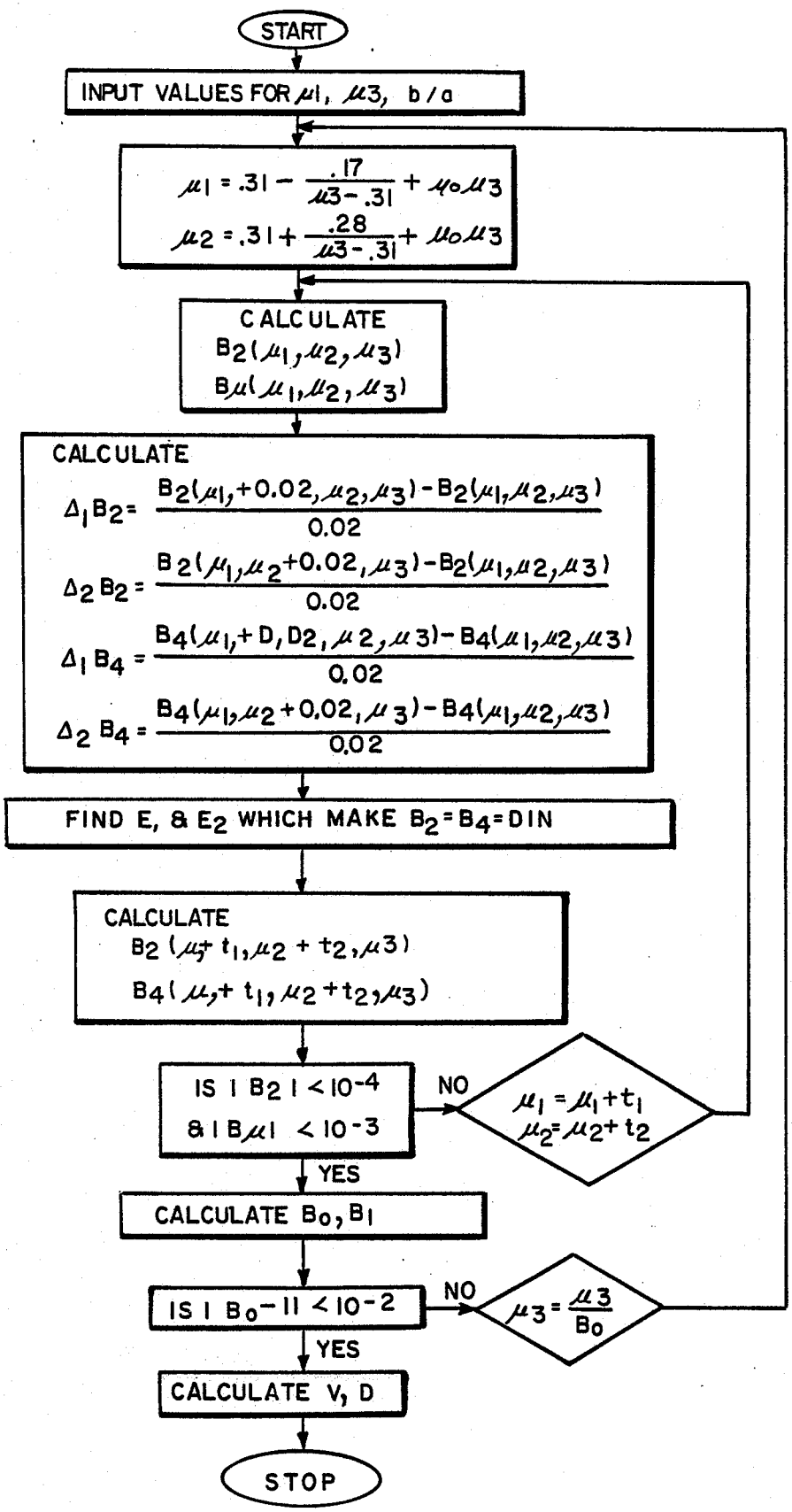
FIG. 16 is a flow diagram of a method for optimizing the design of a system of permanent magnet ring dipoles for NMR imaging.

The design of the magnet for NMR imaging is optimized in accord with the flow diagram illustrated in FIG. 16. Values for $U_o$, $U_3$ and b/a are selected: e.g. $U_o=0.05, 0.10, 0.15, 0.20$; $U_3=0.9$; $b/a=1.8, 2.0, 2.2, 2.5$.

The expansion of the field on the axis near the center of the configuration will be of the form.

$$B_y = B_0 + B_2(z/a)^2 + B_4(z/a)^4 + B_6(z/a)^6 + \ldots$$

Adjust the geometric parameters so that $B_2 = B_4 = 0$. When $B_2$ and $B_4$ are approximately 0, calculate $B_o$ and $B_6$. Also calculate the volume V of permanent magnet material. Vary the values of $U_o$, $U_3$ and b/a to obtain the desired $B_o$ and minimum volume with acceptable distortion (non-uniformity of field), approximately equal to $B_6$.

Check to see that the distortion in the radial direction is within acceptable limits by analyzing the field distortion at points off the center axis. Introduce small amounts of $B_2$ and $B_4$ terms so that the distortion at the extremities of the working volume is reduced at the expense of a small increase in distortion in the interior region of the working volume, thus lowering the overall distortion in the working volume.

Although the procedures described herein are typically used to obtain the optimum field uniformity in the imaging field, the procedures can be used to obtain less than optimum field uniformity, if conditions do not require the optimum.

After the design is optimized by the above procedure, the individual ring dipoles are assembled using the fixtures illustrated in FIGS. 8 and 9 and are tuned by the following procedure.

Figure 11:
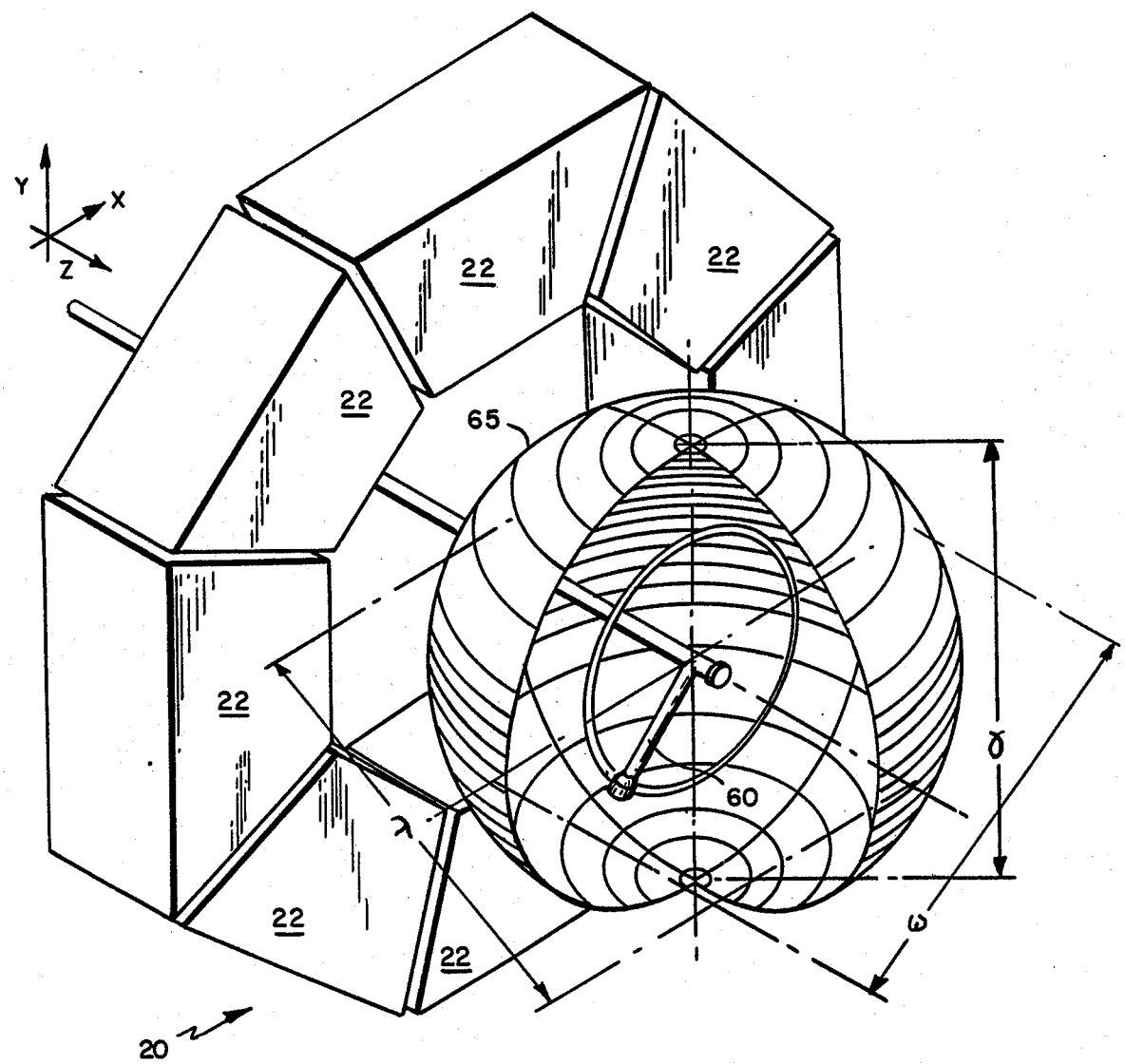
FIG. 11 is an isometric view of a dipole ring magnet positioned with respect to an imaging volume illustrating the measurement of the magnetic flux density in the imaging volume contributed by the ring dipole.

The radial position of segments 22 of the ring dipole is adjusted to eliminate non-uniformities in the dipole magnetic field in the designed imaging volume 65 by measuring the magnetic flux density in the imaging volume using a Hall effect probe 60 as illustrated in FIG. 11. First, the harmonic content of the field for each of the first eight (8) harmonics (corresponding to the eight segments) of the magnetic field in the designed imaging volume is determined by measuring the flux density at a series of points. Then, the first segment is moved radially a small distance by means of the fine adjustment screw 32 of the positioning ram 30. The harmonic content of the field in the designed imaging volume 65 is remeasured. Then the segment 22 is returned to its initial position. Each segment in succession is displaced radially a small distance and the harmonic content of the field in the designed imaging volume 65 is measured. After all eight segments have been displaced and the harmonic content measured, an 8×8 sensitivity matrix is calculated. This sensitivity matrix shows the sensitivity of the harmonic content of the magnetic field in the design imaging volume to each segment of the ring dipole. The elements of the matrix are defined by the following formula:

$$S_{1,n} = \frac{\delta A_{1,n}}{\delta_{r1}}$$

where $\delta A_{1,n}$ is the amount of change in harmonic content of the "n"th harmonic due to the change in position of segment "1" and $\delta r_1$ is the amount of change in position of segment "1".

After the sensitivity matrix has been calculated, the inverse of the sensitivity matrix, or the correction matrix, is calculated. The harmonic content of the field in the design imaging volume is remeasured. The harmonic content for each harmonic is then subtracted from the ideal harmonic content (or designed harmonic content) for each harmonic to obtain a difference vector. The difference vector is then multiplied by the correction matrix to obtain the tuning corrections, i.e. the distance and direction each segment 22 must be moved to more closely approach the ideal or design harmonic content of the design imaging volume 65 contributed by the ring dipole being tuned. Each segment is then moved the calculated amount and the process is repeated until the harmonic content is within specifications, i.e. the magnetic field uniformity is within the design specification.

Figure 12:
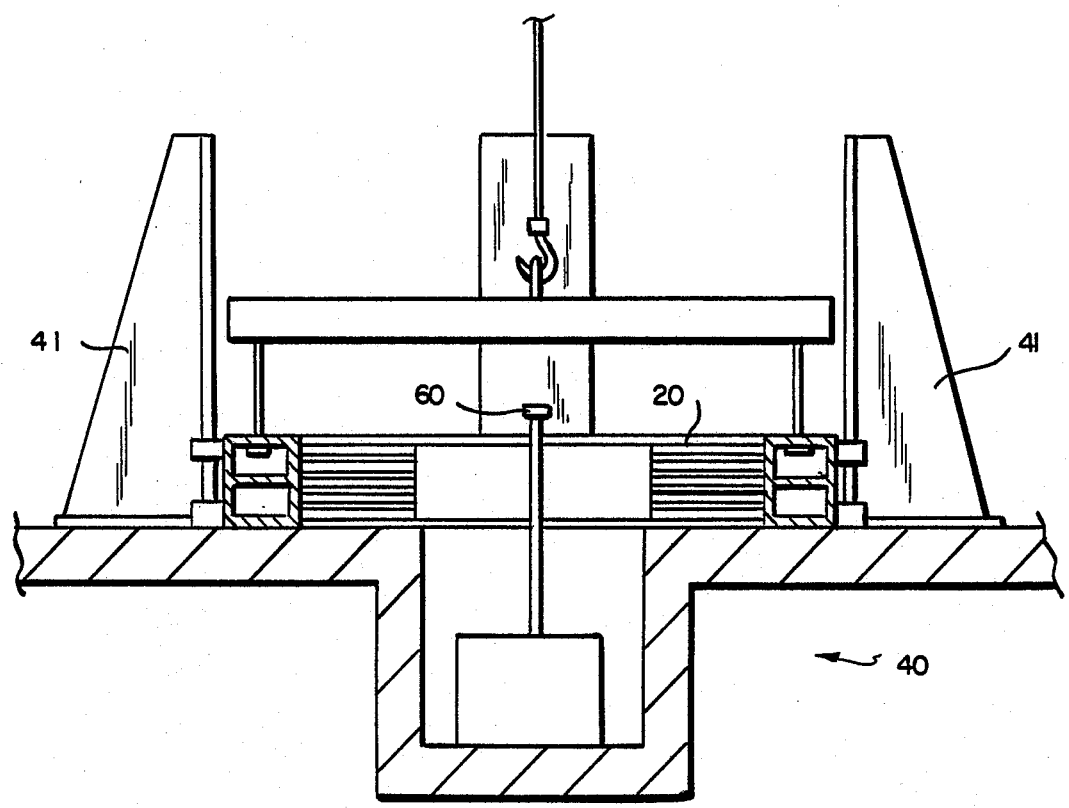
FIG. 12 is a front elevational view, partly in cross-section, of a fixture for adjusting the spacing between dipole ring magnets for tuning an NMR imaging apparatus wherein one dipole ring magnet has already been placed.

A collar structure (not shown) is then attached to the segments of the ring dipole by mechanically attaching the collar to the backing plates of each segment with fasteners or by means of adhesives. The dipole ring with its segments fixed by the collar assembly is then removed from the positioning rams and placed in the assembly fixture 40 as illustrated in FIG. 12 by lowering it along rib guides 41.

Figure 13:
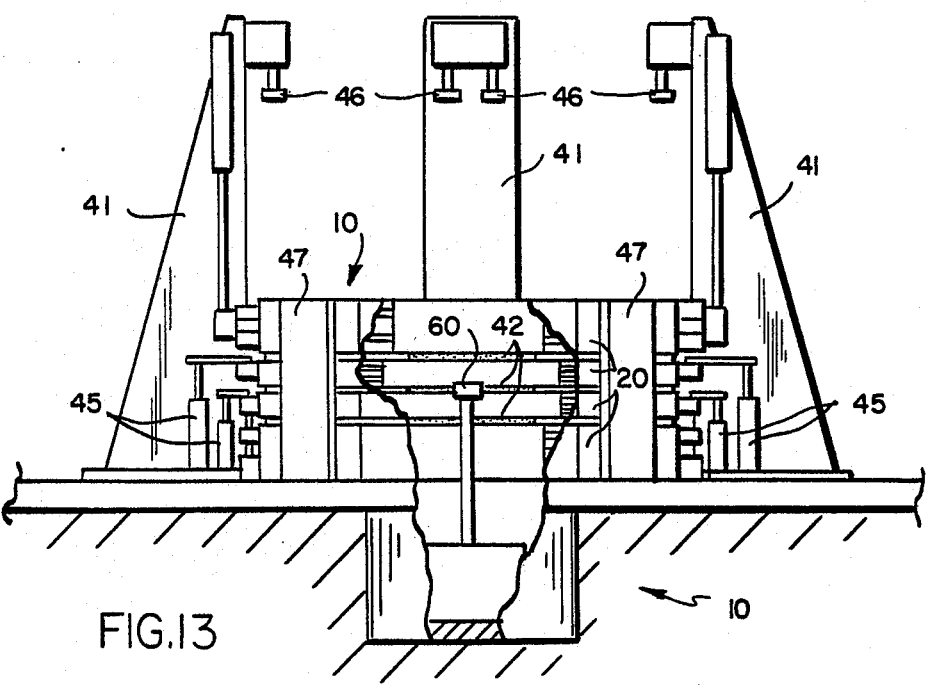
FIG. 13 is a front elevational view, partly in cross-section, of the fixture of FIG. 12 having four dipole ring magnets placed therein and with safety stops in place.

Each successive ring dipole is tuned as described above and placed in the assembly fixture 40 until the design number of ring dipoles, four (4) in this case, are placed in the assembly fixture 40 as shown in FIG. 13. At this point shims 42 have been placed between each of the ring dipoles as each ring dipole is drawn into position adjacent the previous ring dipole by guide arm actuating mechanisms 45. Due to the repelling forces between each ring dipole the ring dipoles must be mechanically locked in position before the next ring dipole is placed in the assembly fixture 40. After the four ring dipoles are in place, safety stops 46 are bolted in place.

The apparatus 10 must now be tuned in the axial direction. The field strength along the axis of the apparatus 10 can be expressed as a power series $$B_z = \sum_n C_n z^n$$

where $B_z$ is the field at point z on the axis and $C_n$ are axial coefficients. The first three axial coefficients are determined by measuring the magnetic flux density at various positions along the axis using Hall effect probe 60. Then the position of the first ring dipole is changed relative to the designed imaging volume by changing the thickness of the tuning shim 42 to change the separation between the first and second dipole. The axial coefficients are then redetermined. The initial tuning shim is replaced between the first ring dipole and the second ring dipole and the distance between the second and third ring dipoles is changed. After determining the axial coefficients for that change, the initial shims are replaced and the process repeated for the separation between the third and fourth ring dipoles. A sensitivity matrix is calculated, similar to the radial tuning, wherein the elements of the matrix are the change in axial coefficient divided by the change in separation. The inverse of the sensitivity matrix, i.e. the correction matrix, is calculated and multiplied with the difference vector calculated from the measured axial coefficients and design axial coefficients. The above multiplication provides the corrections to be made to the separations between the ring dipoles. The process is repeated until the magnetic field with the design imaging volume is within the design specification.

When the magnetic field within the design imaging volume is within the design specification for uniformity, permanent shims are machined from a suitable non-ferromagnetic material to maintain the desired separation between the ring dipoles. After the permanent shims are positioned between the ring dipoles, the collars of the ring dipoles are mechanically fixed together by bolting or welding structural beams 47 to the collars of the ring dipoles.

Figure 14:
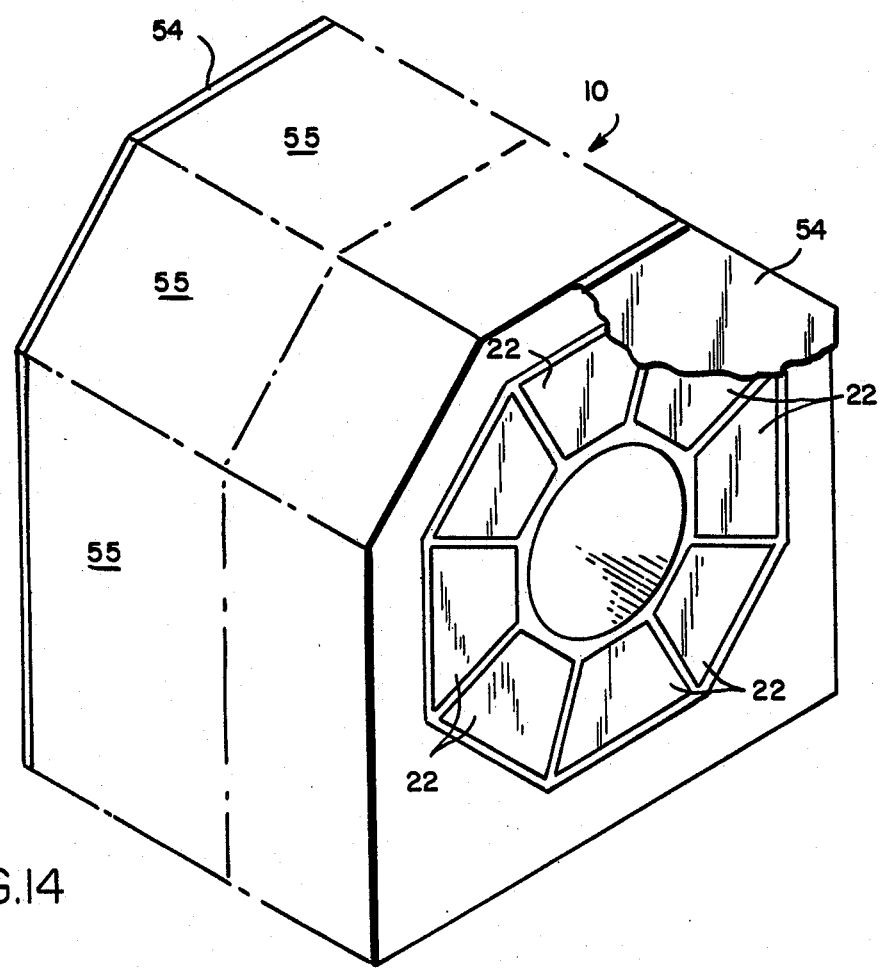
FIG. 14 is an isometric view of an assembled NMR imaging magnet in accord with this invention.
Figure 17:
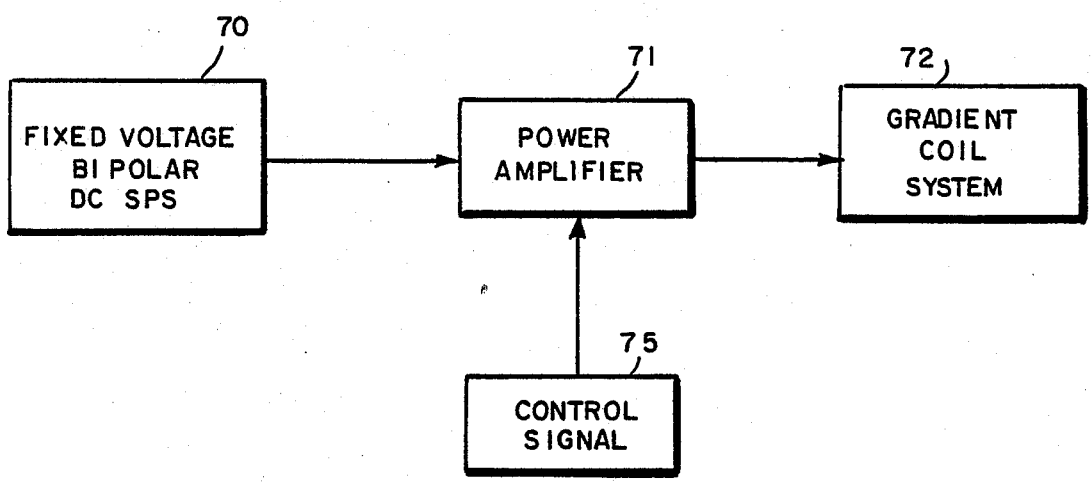
FIG. 17 is a block diagram of a gradient coil system for NMR imaging.

The apparatus 10 is removed from the axial assembly fixture and placed on a base 50 as shown in FIG. 14. The permanent magnet material has a reversible variation of its magnetization with temperature changes. If the temperature varies by more than approximately 1° C. from place to place in the magnet, the field will suffer a temporary distortion. This can be prevented by placing 3 cm of thermal insulation (e.g. urea-formaldehyde foam) over the entire outside surface of the finished magnet as shown in FIG. 14. End covers 54 and side panels 55 are attached for a finished look NMR imaging apparatus having configurations of three, four, and five ring dipoles such as illustrated in FIGS. 4A, 4B, 4C and 4D can be optimized and tuned in a similar manner An NMR imaging system in accord with the invention also has a gradient field superimposed on the bias field provided by the ring dipole apparatus described above. The gradient field can be provided by any means previously used for providing the gradient field for previous NMR imaging systems wherein the bias field was provided by electromagnets. An "air core" current gradient coil system is preferred. The gradient coil can be located outside the bias magnet as in the NMR imaging system of Lauterbur et al. at the State University of New York at Stony Brook or inside the bias magnet adjacent the imaging volume. The power supply to the gradient coil is supplied as illustrated by the block diagram of FIG. 17. A fixed D.C. system power supply (SPS) 70 is coupled to the coil system 72 by a power amplifier 71. The actual field gradients are controlled by a microprocessor 75. The microprocessor is programmed to control pulse polarity, pulse height, pulse width, pulse shape, and duty cycle.

The radio frequency (R.F.) coil detects the nuclear magnetic moment of the hydrogen atoms in the biological tissue. The R. F. System is designed using well known techniques such as those described by Hoult in his paper on "Radio Frequency Coil Technology in NMR Scanning" presented at the 1981 International Symposium on Nuclear Magnetic Resonance Imaging held at the Bowman Gray School of Medicine, Wake-Forest University, Winston-Salem, N.C.

Figure 18:
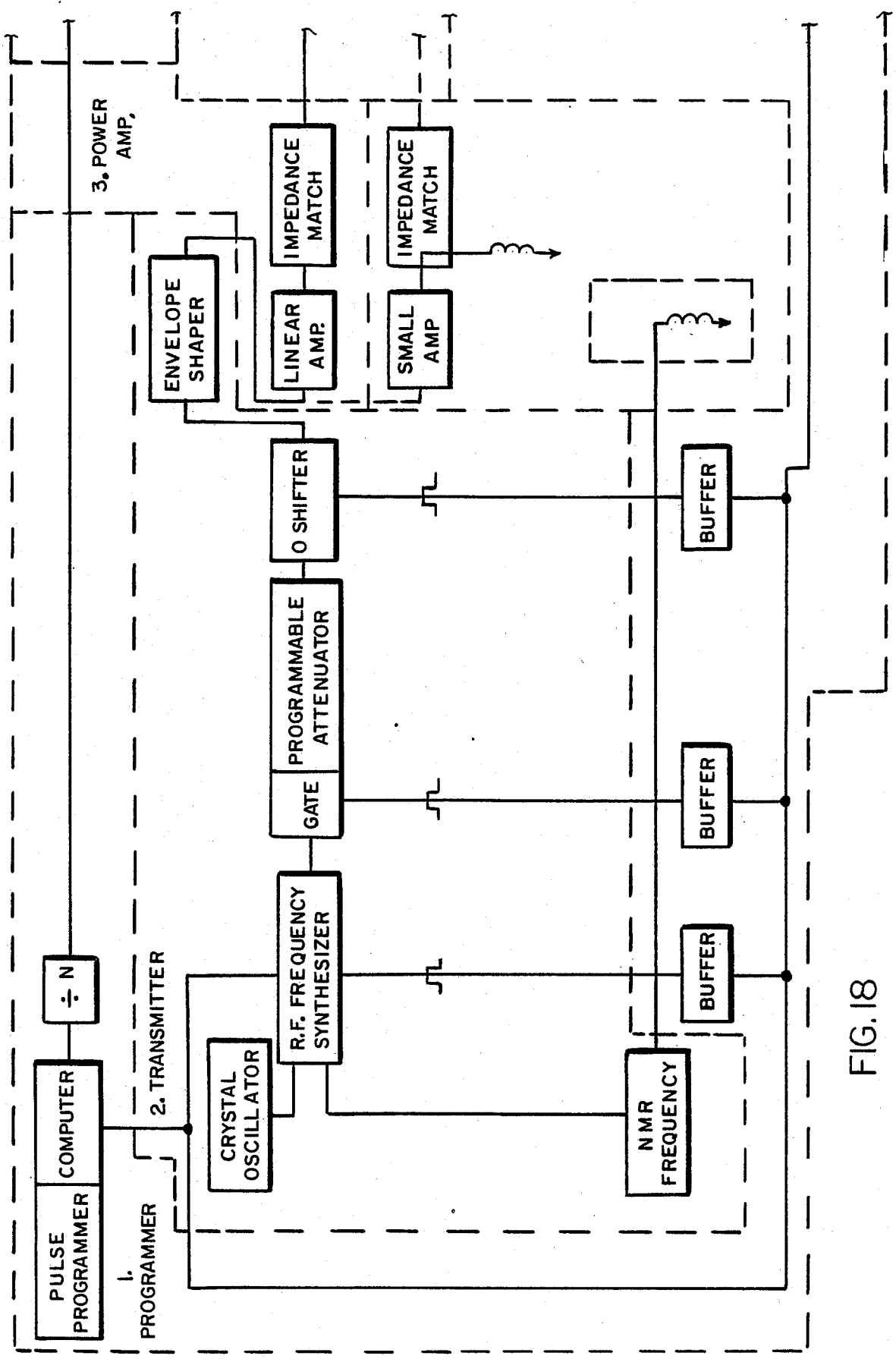
FIG. 18 is a block diagram of an R. F. system for NMR imaging.
Figure 18:
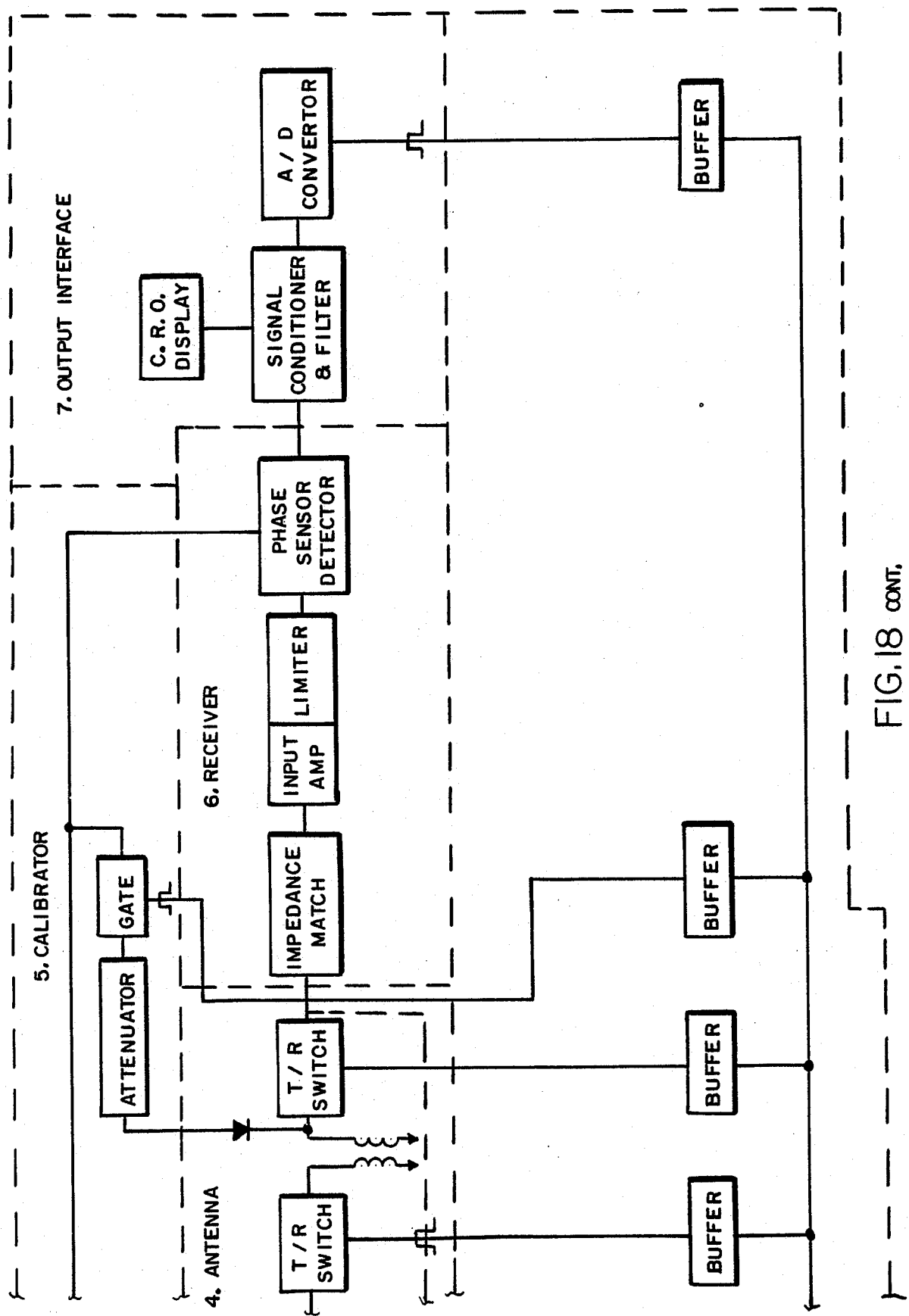

FIG. 18 is a block diagram for the R. F. System. It is divided into eight subsystems. The function of subsystem 1, the programmer, is to take instructions from the microprocessor computer, such as an LSI-11 microprocessor controller, and translate these into the proper voltage signals needed to operate the various gates, phase shifters, etc. in the system. Subsystem 2, the transmitter, provides, under control of the programmer, R. F. pulses of the proper frequency, phase and envelope shape to excite the spin system. Subsystem 3, the power amplifier, amplifies the R. F. pulses provided by the transmitter, and matches their impedance to the transmitting antenna. Subsystem 4 includes the T/R switches for the transmitter and receiver and the transmitting and receiving antennas (whether or not they are the same or separate structures). The calibrator, subsystem 5, provides a signal of the right frequency and a known strength to be injected into the receiver periodically to check the receiver sensitivity and prevent gain drift problems. Subsystem 6 is the receiver which senses the NMR signal and converts it to a useable analog signal. Finally, subsystem 7 is the output interface, which converts the analog signal from the receiver to a digital signal that can be fed to the imaging computer.

The imaging computer reconstructs two or three dimensional images from the data obtained as a function of changing magnetic field gradients in accord with known techniques, such as those using Fourier transformations.

Figure 4A:
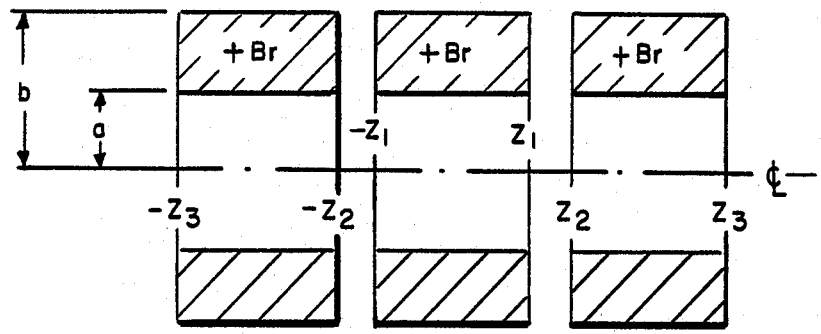
FIG. 4A is a sketch illustrating an embodiment of an NMR imaging apparatus of this invention having three ring dipoles.
Figure 4B:
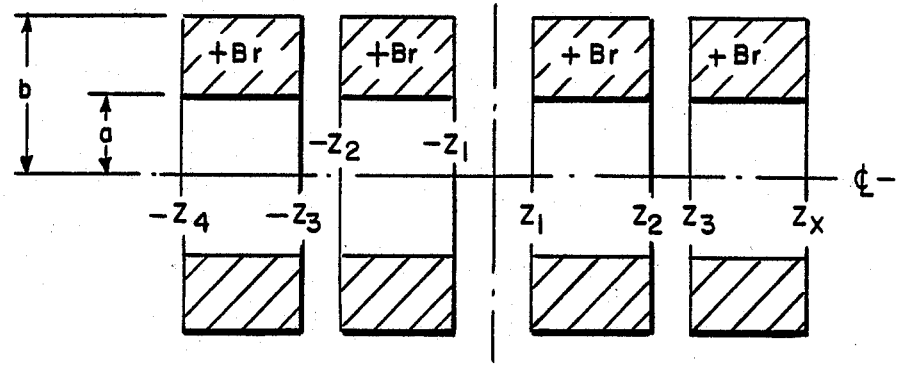
FIG. 4B is a sketch illustrating an embodiment of an NMR imaging apparatus of this invention having four ring dipoles.
Figure 4C:
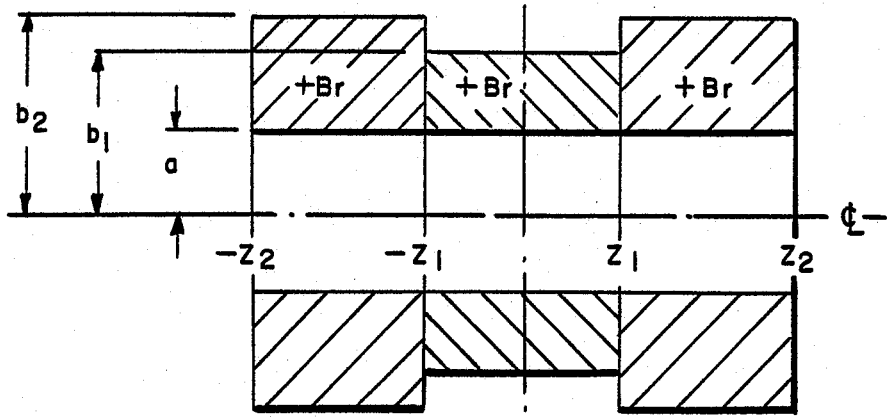
FIG. 4C is a sketch illustrating an embodiment of an NMR imaging apparatus of this invention having three ring dipoles wherein the center ring dipole has a smaller outer radius than the outer ring dipoles.
Figure 4D:
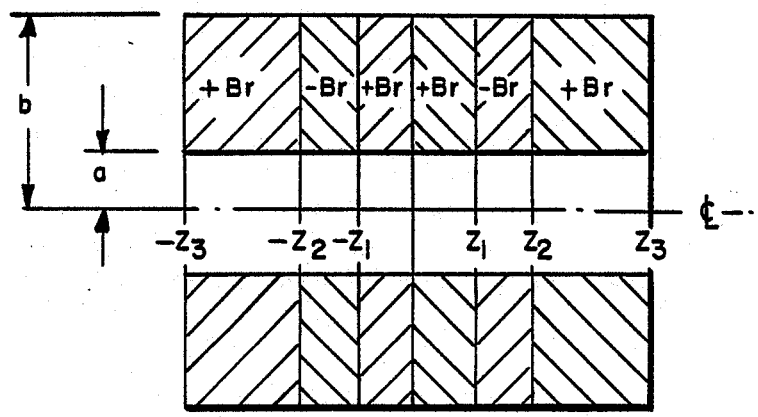
FIG. 4D is a sketch illustrating an embodiment of an NMR imaging apparatus of this invention having five ring dipoles wherein two of the ring dipoles comprise material having a negative residual inductance, $B_r$.

Although the invention has been described in detail for an NMR imaging apparatus comprised of four (4) ring dipoles each having eight segments of permanent magnet material forming a substantially continuous ring, the methods described are equally applicable to such systems having more or less ring dipoles and to ring dipoles made of more or less segments. In fact, the most preferred axial arrangement of ring dipoles consists of a positive ring dipole in the center surrounded alternately by two small negative ring dipoles and then two larger ring dipoles as illustrated in FIG. 4D. However, for practical reasons an arrangement as illustrated in FIG. 4B is preferred for an actual apparatus.

The invention has been described in detail including the preferred embodiments thereof. However, it will be appreciated that those skilled in the art, upon consideration of the present disclosure, may make modifications and improvements within the spirit and scope of this invention.

We claim:

1. An NMR imaging apparatus having a desired imaging volume for imaging of biological tissue, said apparatus comprising bias means for generating a bias field, means for generating gradient fields, and radio frequency means for applying a pulse of electromagnetic radiation to the biological tissue and for detecting the resultant signals emitted from said tissue;
   wherein said bias means comprises a plurality of dipole ring magnets, each dipole ring magnet comprising a plurality of segments, each segment comprising an oriented, anisotropic permanent magnet material arranged in a ring so that there is a substantially continuous ring of permanent magnet material.

2. The NMR imaging apparatus of claim 1 wherein said bias field is generated by two, three, four or five dipole ring magnets.

3. The NMR imaging apparatus of claim 2 wherein the two exterior dipole ring magnets have a larger outer radius than the remaining dipole ring magnet(s).

4. The NMR imaging apparatus of claim 1 wherein each dipole ring magnet comprises eight segments of permanent magnet material.

5. The NMR imaging apparatus of claim 4 wherein each segment has a substantially trapezoidal shape.

6. The NMR imaging apparatus of claim 1 wherein each segment is built up from a plurality of smaller bricks.

7. The NMR imaging apparatus of claim 1 wherein the bias field within the desired imaging volume has a field uniformity, $\Delta B/B$, less than $5 \times 10^{-4}$.

8. The NMR imaging apparatus of claim 1 wherein the dipole ring magnets are located axially in relation to each other to obtain a predetermined field non-uniformity over a predetermined central imaging volume with a minimum mass of permanent magnet material.

9. The NMR imaging apparatus of claim 1 wherein the dipole ring magnets are located axially in relation to each other to obtain a minimum field non-uniformity over a predetermined central imaging volume with a predetermined mass of permanent magnet material.

* * * * *